Oct. 23, 1962 W. L. WILLIS 3,060,252
ENCAPSULATED THERMOELECTRIC ELEMENTS
Filed June 19, 1961
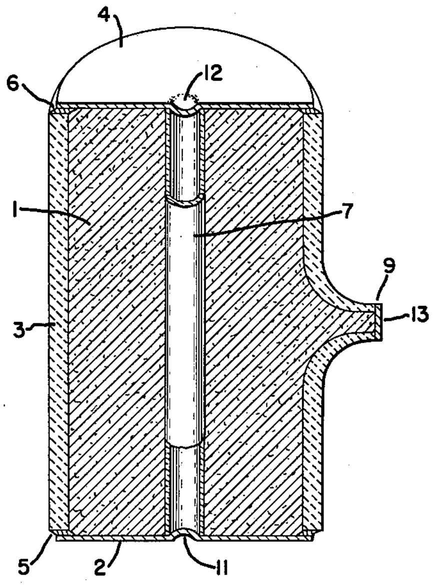
INVENTOR:
WARREN L. WILLIS,
BY Dudley T. Ready
HIS AGENT.

United States Patent Office 3,060,252

Patented Oct. 23, 1962

3,060,252

ENCAPSULATED THERMOELECTRIC ELEMENTS

Warren Layton Willis, Syracuse, N.Y., assignor to General Electric Company, a corporation of New York Filed June 19, 1961, Ser. No. 118,106
7 Claims. (Cl. 136—4)

The present invention relates to improvements in the construction of encapsulated thermoelectric elements which allow for certain expansion mismatches between the casing and the body of thermoelectric material.

The thermoelectric elements considered herein are those which make a direct conversion of heat to electrical energy (or the reverse) by means of the Seebeck, Peltier and Thomson effects. In a thermoelectric generator producing electrical energy directly from a heat source there is primary reliance upon the stimulation of carriers along a temperature gradient in a material. In a single member subjected to a temperature gradient, this stimulation of the carriers tends to create a current flow impelled by the temperature gradient. The direction and intensity of the current flow is a function of the nature of the thermoelectric material of the member.

The most efficient materials for thermoelectric applications are certain semiconductors, of which lead telluride and chromium antimonide, often doped with impurities to optimize the thermoelectric effect, are examples. Unfortunately, semiconductors have generally poor mechanical properties and often, particularly at high temperatures, have poor chemical stability. Because of the wide variation in the chemical constitution of semiconductor materials, there is a correspondingly large variation in their properties. In general, however, the semiconductors are brittle and easily break when subjected to small shear or tensile stress. Although they usually possess some compressional strength, this is limited. Lead telluride for example, will break under a small compressional stress. Many semiconductors readily oxidize and/or have very high vapor pressures at high temperatures. These effects lead to changes in the stoichiometric proportions of the constituent elements which are critical to the optimum thermoelectric properties. As an example, lead telluride semiconductors prepared as p-type elements suitable for thermoelectric generation of electrical current, have been known to deteriorate to n-type material and thereby reverse the direction of the output current.

A solution to these problems has been found in encapsulating individual thermoelectric elements in hermetically sealed housings in which the body of thermoelectric material is molded in the housing to impart mechanical strength and chemical stability to the body. The construction is disclosed and claimed in the copending patent application of Erwin Fischer-Colbrie and Willem J. van der Grinten, Serial No. 8,020, filed February 11, 1960, and assigned to the same assignee.

However, with certain thermoelectric materials, the mechanical construction of the thermoelectric elements is difficult to realize because of expansion differences between the casing and the body of thermoelectric material with variations in temperature. For example, chromium antimonide has a positive volume change on solidification so that an encapsulating casing filled with molten CrSb will fracture when CrSb expands during solidification.

Accordingly, it is an object of the invention to provide an encapsulated thermoelectric element which allows for substantial differences in the expansion of the encapsulating means and the body of thermoelectric material.

Briefly stated, in accordance with one aspect of the invention, an encapsulated thermoelectric element is provided comprised of an impermeable refractory casing extending between a pair of spaced terminal members and hermetically sealed thereto which encloses a body of semiconductor material exhibiting a thermoelectric effect. Allowance is made for differential expansion between the encapsulating means and the body of thermoelectric material by forming the element with a hollow compressible tube extending between the terminal members through the body which permits the body to expand inwardly, either deforming or crushing the tube.

The features of the invention which are believed to be novel are set forth with particularity in the appended claims. The invention itself, however, both as to its organization and method of operation, together with further objects and advantages thereof, may best be understood by reference to the following description when taken in connection with the drawings wherein FIGURE 1 is a perspective view partially in cross section of an improved thermoelectric element incorporating the present invention.

FIGURE 1 illustrates an encapsulated thermoelectric element adapted to allow for differential expansion between the encapsulating housing and the enclosed body of thermoelectric material. A hermetically sealed housing for the body of thermoelectric material is provided by a ceramic casing 3 extending between a pair of metallic terminal members 2 and 4. The ceramic casing 3 is sealed to the metallic terminal members 2 and 4 by means of an eutectic seal formed at 5 and 6. A body of thermoelectric material 1 is molded in this housing by being poured through an opening 9 in the casing 3 while in a molten state. The thermoelectric body 1 forms a hollow cylinder about an axially extending, compressible glass tube 7 having a high melting point which is preferably quartz.

The thermoelectric materials which provide the most efficient energy conversion are semiconductors prepared with an optimized thermoelectric effect. The optimum effect is generally obtained with a charge carrier concentration on the order of $10^{19}$ per cubic centimeter. This condition is produced by the selection of proper stoichiometric proportions of the constituent elements. With chromium antimonide, the preparation preferably includes doping with an excess of chromium and a material such as selenium.

The encapsulating housing of the FIGURE 1 element is constructed in the same manner as the encapsulating housing disclosed in the above cited patent application Serial No. 8,020. The functions of the housing are to protect the thermoelectric body from the atmosphere, to prevent mass transport and to supply mechanical strength to the semi-conductor body. An excellent type of material for the casing is the high-temperature ceramic family including materials such as Forsterite and Alumina. These ceramics have the property of being good heat insulators and therefore have a minimal heat loss.

The preferred mode of fabrication of the FIGURE 1 element with the semiconductor body completely filling the encapsulating housing requires initially forming the housing. A cylindrical configuration of the thermoelectric element is convenient, with the hollow cylindrical ceramic casing 3 closed on each end by flexible metallic terminal members 2, 4. The terminal members provide means to make electrical connections to the thermoelectric bodies and also thermal connections to a heat source and a heat sink. The flexibility of the terminal members is assured by utilizing sufficiently thin metallic elements. To provide a hermetic seal for the encapsulating housing for high temperature operation it is necessary to bond the terminal members to the ceramic casing. The method used for making this seal is that method developed by J. E. Beggs for vacuum tubes as described in the IRE Transactions of the PGCP, volume CP–4, No. 1, March 1957, "Sealing Metal and Ceramic Parts by Forming Reactive Alloys," commonly referred to as "eutectic" bonding. It is essential that the ceramic and metallic terminals be selected to have a matched temperature coefficient of expansion to prevent breakage of the encapsulating housing at elevated temperatures. However, with a proper match of materials, the encapsulating housing may be used in applications at temperatures well over 1000° C. For a Forsterite ceramic, iron terminal members on the order of fifteen mils in thickness provide a suitable expansion match and sufficient flexibility.

It is desirable to provide an encapsulating housing which is matched to the temperature coefficient of expansion of the thermoelectric material. However, this cannot always be attained. CrSb has a positive volume change on solidification and therefore cannot be matched to ceramics. The tube 7 in the FIGURE 1 thermoelectric element is provided to allow for expansion mismatches such as occur with the use of materials like CrSb. In this embodiment the tube 7 is a hollow quartz tube with a wall thickness on the order of a half mil. Such a tube allows the CrSb to expand internally without fracturing the encapsulating housing.

In the preferred mode of fabrication, a quartz tube 7 is placed in the center of a preformed encapsulating housing (before the housing is sealed) and extends the length of the element. The position and configuration of the tube are not critical. It provides a cavity extending the length of the thermoelectric body to allow for transverse strain. The tube 7 is held in position by projections 11 and 12 on terminal members 2 and 4. The housing is then filled by pouring molten semiconductor material through the opening 9 in the casing 3. The filling may be performed in other ways such as repeated steps of filling with semiconductor powder and subsequent melting. The fabrication is performed in a vacuum or an atmosphere of an inert gas. When the element is filled with CrSb, the casing contracts with cooling and the enclosed body expands upon solidification. This expansion differential is allowed by the quartz tube 7 which is compressed either by being deformed or crushed. In the case of highly unstable semiconductors, it may be desirable to cover the small opening 9 in the casing with a ceramic seal 13.

The embodiment of FIGURE 1 provides terminal members at each end of the thermoelectric element. These terminal members are flexible and therefore allow for longitudinal expansion mismatch between the thermoelectric body and the encapsulating housing. However, it is possible to use different geometric configurations for the thermoelectric element. For example, one or both of the terminal members can be inserted through the encapsulating housing from the side of the element. This results in smaller terminal members and reduces the effects of differential expansion between the casing and the terminal members. The terminal members must nevertheless be sealed to the ceramic casing and it is necessary to allow for differential expansion along the axis of the element for high-temperature operation. In the event that the thermoelectric material only partially fills the housing, this differential expansion is allowable.

Thermoelectric elements constructed as illustrated in FIGURE 1 have been successfully operated at temperatures in excess of 1000° C. As an example, one type of element was comprised of a Forsterite casing 3 three inches long having an outside diameter of one quarter of an inch. The ratio of the outside diameter to the inside diamter was 3:2 and the enclosed semiconductor material 1 was chromium antimonide. The quartz tube 7 was 30 mils in diameter with a thickness of one mil. With this construction, neither the housing nor the semiconductor body fracture. It has been empirically demonstrated that a ceramic casing having a thickness of less than one eighth of an inch has sufficient strength to constrain a semiconductor body to inward expansion into a cavity. It has also been found that in spite of the poor compressional strength of the semiconductors, they can withstand the stresses produced with variations in operating temperatures without fractures.

When an element such as that illustrated in FIGURE 1 is placed with one terminal, for example electrode 2, in contact with a heat sink and the other terminal in contact with a heat source, a thermoelectric emf will be produced in the direction indicated. When a second element is placed between the heat source and heat sink which incorporates a thermoelectric material providing an emf in the opposite direction and one pair of adjacent terminals are electrically connected, a thermocouple is produced in a manner well known to those skilled in the art. As a practical source of electrical energy, it is necessary to provide a large number of such thermocouple pairs which are arranged between the heat source and heat sink and with their terminals interconnected in the usual manner to increase the voltage and/or current capacity of the generator.

While the fundamental novel features of the invention have been shown and described as applied to illustrative embodiments, it is to be understood that all modifications, substitutions and omissions obvious to one skilled in the art are intended to be within the spirit and scope of the invention as defined by the following claims.

What is claimed is:

1. An encapsulated thermoelectric element comprising: encapsulating means including a strong impermeable ceramic casing forming a hermetically sealed housing for a body of thermoelectric material; a body of semiconductor material exhibiting a thermoelectric effect conforming to the inner surface of said encapsulating means; terminal members positioned at spaced intervals along said body to provide electrical connections thereto; and a compressible member extending through said body of semiconductor material adapted to relieve expansive stresses below the fracturing point of said encapsulating means and thereby permit inward expansion of said body upon solidification thereof.

2. An encapsulated thermoelectric element comprising: encapsulating means including a strong impermeable casing forming a hermetically sealed housing for a body of thermoelectric material; a body of semiconductor material exhibiting a thermoelectric effect conforming to the inner surface of said encapsulating means; terminal members positioned at the ends of said body to provide electrical connections thereto; and a hollow, thin-walled glass tube extending through said body of semiconductor material adapted to relieve any expansive stresses below the fracturing point of said encapsulating means and thereby permit inward expansion of said body upon solidification thereof.

3. An encapsulated thermoelectric element comprising: a pair of spaced metallic terminal members; a mechanically strong ceramic casing extending between said terminal members; sealing means between said ceramic casing and each of said terminal members providing a hermetically sealed housing; a body of semiconductor material exhibiting a thermoelectric effect conforming to the inner surface of said housing; and a compressible tube extending through said body substantially the length of said element adapted to relieve expansive stresses below the fracturing point of said ceramic casing upon the solidification of said body.

4. The encapsulated thermoelectric element of claim 3 wherein said body of semiconductor material is comprised of chromium antimonide.

5. The encapsulated thermoelectric element of claim 3 wherein said compressible tube consists of a quartz tube having a wall thickness on the order of one half mil.

6. A method of forming an encapsulated thermoelectric element which permits the body of thermoelectric material to expand upon solidification comprising: placing a frangible tube adapted to relieve any expansive stresses below the fracturing point of said encapsulating housing within an encapsulating housing which extends the length thereof; and filling said housing with a semiconductor material in the molten state exhibiting a thermoelectric effect.

7. A method of forming an encapsulated thermoelectric element which permits the body of thermoelectric material to expand upon solidification, comprising: forming an encapsulating enclosure of a mechanically strong ceramic cylinder sealed at either end with a flexible metallic member and having therein an axially oriented compressible tube adapted to relieve any expansive stresses below the fracturing point of said encapsulating enclosure; filling said housing with a molten semiconductor material exhibiting a thermoelectric effect; and allowing said semi-conductor material to solidify.

References Cited in the file of this patent

UNITED STATES PATENTS

| | | |
|---|---|---|
| 1,848,655 | Petrik | Mar. 8, 1932 |
| 2,626,970 | Hunrath | Jan. 27, 1953 |